United States Patent
Friddell

(10) Patent No.: US 12,525,962 B2
(45) Date of Patent: Jan. 13, 2026

(54) HORNER FORM ARBITRARY COEFFICIENT MULTIPLIERLESS FIR FILTER

(71) Applicant: THE BOEING COMPANY, Arlington, VA (US)

(72) Inventor: Thomas H. Friddell, Kent, WA (US)

(73) Assignee: The Boeing Company, Arlington, VA (US)

( * ) Notice: Subject to any disclaimer, the term of this patent is extended or adjusted under 35 U.S.C. 154(b) by 15 days.

(21) Appl. No.: 18/625,044

(22) Filed: Apr. 2, 2024

(65) Prior Publication Data

US 2025/0309866 A1  Oct. 2, 2025

(51) Int. Cl.
  *H03H 17/02* (2006.01)
  *H03H 17/06* (2006.01)
  *H03H 17/00* (2006.01)

(52) U.S. Cl.
  CPC .... *H03H 17/0294* (2013.01); *H03H 17/0227* (2013.01); *H03H 17/06* (2013.01); *H03H 2017/0081* (2013.01)

(58) Field of Classification Search
  CPC ........... H03H 17/0294; H03H 17/0227; H03H 17/06; H03H 2017/0081
  See application file for complete search history.

(56) References Cited

U.S. PATENT DOCUMENTS

| | | | | |
|---|---|---|---|---|
| 4,862,402 A * | 8/1989 | Shah | ................... | H03H 17/0225 708/315 |
| 5,222,035 A * | 6/1993 | Nakase | ................... | H03H 17/06 708/319 |
| 5,262,974 A * | 11/1993 | Hausman | ............... | G06F 7/4824 708/628 |
| 5,479,454 A * | 12/1995 | Greggain | ........... | H03H 17/0233 708/319 |
| 6,411,976 B1 * | 6/2002 | Cesari | ................ | H03H 17/0286 708/319 |
| 11,139,800 B1 * | 10/2021 | Weiss | ................. | H03H 17/0255 |

OTHER PUBLICATIONS

Machine translation of DE-10250871-B4 (Year: 2007).*

(Continued)

*Primary Examiner* — Jean B Corrielus
(74) *Attorney, Agent, or Firm* — Harrity & Harrity, LLP

(57) ABSTRACT

The present disclosure provides implementations of a filter suitable for use in quantum computing systems and other low-power, high-speed applications. In some aspects, a filter circuit includes a series-connected arrangement of unit delays and summers in an alternating pattern. The filter circuit further includes a plurality of coefficient multipliers, each having a respective output connected with one or more of the summers, and each including a multiplexing stage including one or more multiplexers addressed using one or more bits of a respective input coefficient vector. A first coefficient multiplier of the plurality of coefficient multipliers includes a partial product stage configured to provide a plurality of integer partial products of an input data vector to the multiplexing stages of the plurality of coefficient multipliers.

20 Claims, 9 Drawing Sheets

(56) References Cited

OTHER PUBLICATIONS

Aksoy, Levent, et. al., "A Tutorial on Multiplierless Design of FIR Filters: Algorithms and Architectures", Circuits, Syst, Signal Process (2014) 33:1689-1719.

Yli-Kaakinen, Juha, et. al., "A Systematic Algorithm For the Design of Multiplerless FIR Filters", IEEE, 2001, pp. II-185-188. Yli-Kaakinen and Tapio Saramaki, "A Systematic Algorithm for the Design of Multiplierless FIR Filters", The 2001 IEEE International Symposium on Circuits and Systems (Cat. No. 01CH37196), ISCAS 2001, https://ieeexplore.ieee.org/document/921038 <https://url.us.m.mimecastprotect.com/s/IRZOCIYkVmc24norhGc0EX?domain=ieeexplore.ieee.org>).

\* cited by examiner

HORNER FORM ARBITRARY COEFFICIENT MULTIPLIERLESS FIR FILTER

FIELD

Aspects of the present disclosure relate to implementations of a folded finite impulse response (FIR) filter that are suitable for use in quantum computing systems and other low-power, high-speed applications.

BACKGROUND

Quantum computing systems are highly sensitive to environmental influences, such as magnetic field variations, electromagnetic interference, and thermal noise. As a result, hardware forming the qubits of a quantum computing system is typically operated in a shielded environment at temperatures near absolute zero (0 K). To provide error correction and reliable operation, quantum computing systems may include hundreds or thousands of qubits that operate coherently and simultaneously.

To avoid running long wires to the quantum computing system from external test equipment, drive electronics may be installed and operated in a refrigerated environment, e.g., provided by a dilution refrigerator. The drive electronics may include waveform synthesizers that drive the qubits, where each waveform synthesizer includes a high-speed, continuously operating clock to maintain proper qubit control phase synchronized with the qubit phase. However, a dilution refrigerator has only a limited capacity to remove heat generated by the drive electronics while maintaining low operational temperatures.

SUMMARY

The present disclosure provides a filter circuit in one aspect, the filter circuit including: a series-connected arrangement of unit delays and summers in an alternating pattern, and a plurality of coefficient multipliers, each having a respective output connected with one or more of the summers, and each including a multiplexing stage including one or more multiplexers addressed using one or more bits of a respective input coefficient vector. A first coefficient multiplier of the plurality of coefficient multipliers includes a partial product stage configured to provide a plurality of integer partial products of an input data vector to the multiplexing stages of the plurality of coefficient multipliers.

In one aspect, in combination with any example filter circuit above or below, the one or more multiplexers include a first multiplexer and a second multiplexer. The multiplexing stage further includes: a left-shifter connected with an output of the first multiplexer, wherein the one or more bits that address the first multiplexer are more significant than the one or more bits that address the second multiplexer; and a summer connected with an output of the second multiplexer, and to an output of the left-shifter.

In one aspect, in combination with any example filter circuit above or below, the multiplexing stage further comprises a unit delay connected with an output of the summer.

In one aspect, in combination with any example filter circuit above or below, the partial product stage includes: one or more left-shifters; and one or more summers configured to receive the input data vector and an output of one of the one or more left-shifters.

In one aspect, in combination with any example filter circuit above or below, the input coefficient vectors that are provided to the plurality of coefficient multipliers are symmetrical.

In one aspect, in combination with any example filter circuit above or below, the one or more multiplexers of the first coefficient multiplier has a respective N select lines, and the partial product stage is configured to provide integer partial products from 0 to $2^N-1$.

The present disclosure provides a coefficient multiplier circuit for a filter in one aspect, the coefficient multiplier circuit including: a partial product stage configured to provide a plurality of integer partial products of an input data vector. The coefficient multiplier circuit further includes a multiplexing stage including: one or more multiplexers configured to receive the plurality of integer partial products of the input data vector, and addressed using one or more bits of an input coefficient vector; and an output connected with the one or more multiplexers, and with one or more summers of the filter.

In one aspect, in combination with any example coefficient multiplier circuit above or below, the filter is one of a finite impulse response (FIR) filter, an infinite impulse response (IIR) filter, and an autoregressive, moving average (ARMA) filter.

In one aspect, in combination with any example coefficient multiplier circuit above or below, the one or more multiplexers includes a first multiplexer and a second multiplexer. The multiplexing stage further includes a left-shifter connected to an output of the first multiplexer, wherein the one or more bits that address the first multiplexer are more significant bits of the input coefficient vector than those of the second multiplexer. The multiplexing stage further includes a summer connected to an output of the second multiplexer, and to an output of the left-shifter.

In one aspect, in combination with any example coefficient multiplier circuit above or below, the multiplexing stage further comprises a unit delay connected with an output of the summer.

In one aspect, in combination with any example coefficient multiplier circuit above or below, the partial product stage includes one or more left-shifters, and one or more summers configured to receive the input data vector and an output of one of the one or more left-shifters.

In one aspect, in combination with any example coefficient multiplier circuit above or below, the one or more multiplexers has a respective N select lines, and wherein the partial product stage is configured to provide integer partial products from 0 to $2^N-1$.

In one aspect, in combination with any example coefficient multiplier circuit above or below, the coefficient multiplier circuit further includes a second multiplexing stage including: one or more second multiplexers configured to receive the plurality of integer partial products of the input data vector, and addressed using one or more bits of a second input coefficient vector; and a second output connected with the one or more second multiplexers, and with one or more other summers of the filter.

The present disclosure provides a system in one aspect, the system including: a refrigeration system configured to maintain a refrigerated environment; a plurality of qubits disposed in the refrigerated environment; and control circuitry connected to the plurality of qubits. The control circuitry includes, for each qubit of the plurality of qubits, a respective waveform synthesizer configured to drive the qubit. The waveform synthesizer includes an interpolation filter circuit including: a series-connected arrangement of unit delays and summers in an alternating pattern; and a plurality of coefficient multipliers, each having a respective output connected with one or more of the summers, and each including a multiplexing stage including one or more multiplexers addressed using one or more bits of a respective input coefficient vector. A first coefficient multiplier of the plurality of coefficient multipliers includes a partial product stage configured to provide a plurality of integer partial products of an input data vector to the multiplexing stages of the plurality of coefficient multipliers.

In one aspect, in combination with any example system above or below, the refrigeration system includes a dilution refrigerator defining a plurality of temperature stages. The plurality of qubits are disposed in a lowest temperature stage of the plurality of temperature stages. The control circuitry is disposed in another stage of the plurality of temperature stages.

In one aspect, in combination with any example system above or below, the one or more multiplexers include a first multiplexer and a second multiplexer. The multiplexing stage further includes: a left-shifter connected with an output of the first multiplexer, wherein the one or more bits that address the first multiplexer are more significant than the one or more bits that address the second multiplexer. The multiplexing stage further includes a summer connected with an output of the second multiplexer, and to an output of the left-shifter.

In one aspect, in combination with any example system above or below, the multiplexing stage further comprises a unit delay connected with an output of the summer.

In one aspect, in combination with any example system above or below, the partial product stage includes one or more left-shifters, and one or more summers configured to receive the input data vector and an output of one of the one or more left-shifters.

In one aspect, in combination with any example system above or below, the input coefficient vectors that are provided to the plurality of coefficient multipliers are symmetrical.

In one aspect, in combination with any example system above or below, the one or more multiplexers of the first coefficient multiplier has a respective N select lines, and wherein the partial product stage is configured to provide integer partial products from 0 to $2^N-1$.

BRIEF DESCRIPTION OF THE DRAWINGS

So that the manner in which the above recited features can be understood in detail, a more particular description, briefly summarized above, may be had by reference to example aspects, some of which are illustrated in the appended drawings.

DETAILED DESCRIPTION

Figure 1:
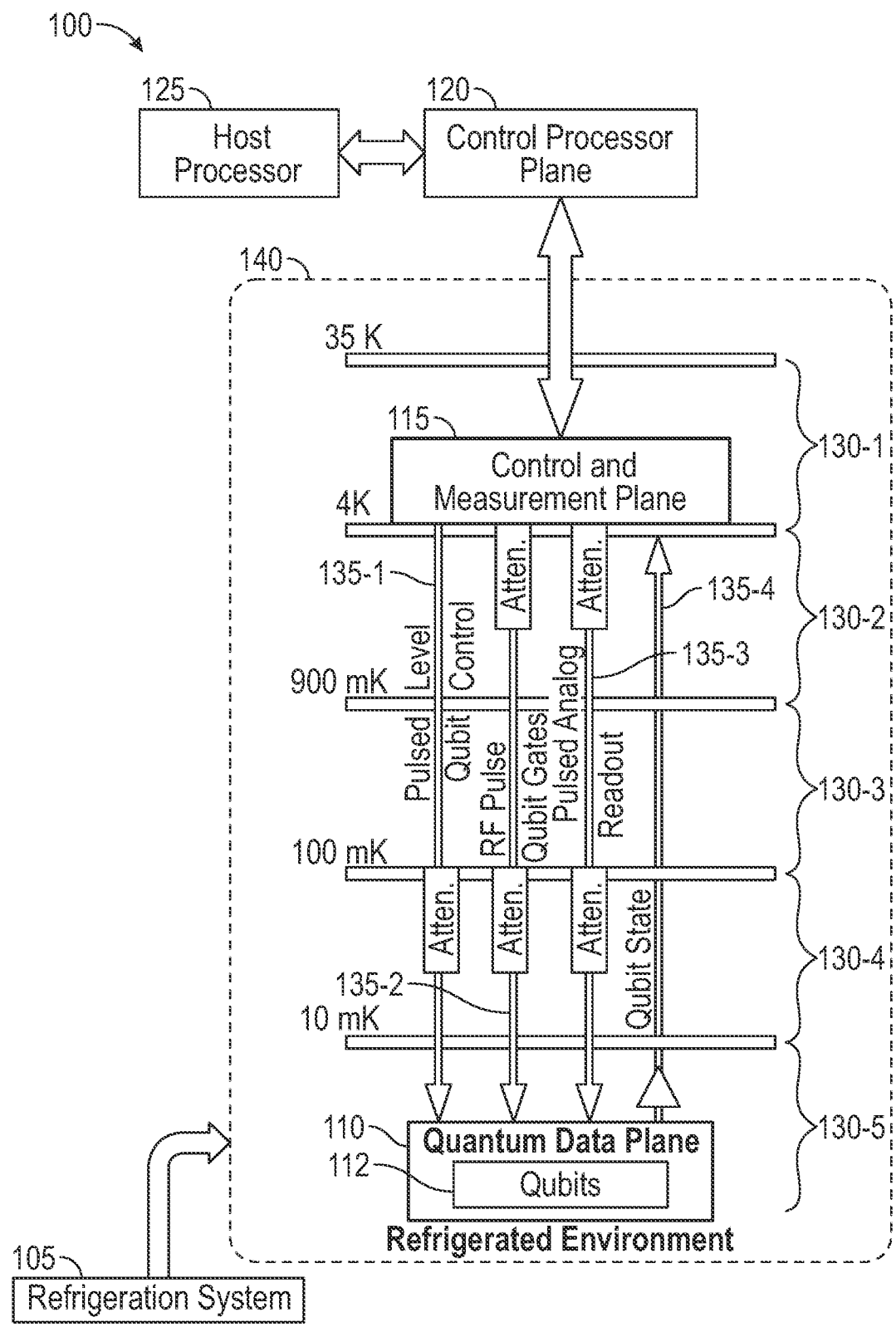
FIG. 1 is a diagram illustrating an exemplary quantum computing system, according to one or more aspects.

The present disclosure provides implementations of a folded finite impulse response (FIR) filter that are suitable for use in quantum computing systems. The folded FIR filter uses an arbitrary coefficient multiplierless design which, in combination with the Horner form of the folded FIR filter, requires significantly less hardware (e.g., fewer half adders, full adders, and registers). The folded FIR filter may be implemented within an interpolator to allow waveform synthesizers to run at lower rates for power savings. For example, the interpolator may interpolate "missing" samples to increase the synthesized waveform from 1 gigasample per second (GSPS) to 2 GSPS. In this example, the timing margin provided by the folded FIR filter implementation allow the waveform synthesis to occur without the hardware complexity and increased power consumption of memory ping-ponging.

Further, use of a FIR filter (whether folded or non-folded) may result in a greater fidelity of the qubits of the quantum computing system due to reduced crosstalk from other qubit signals on a shared line. Fidelity generally describes qubit state angle errors that determine the reliability of the computations of the qubit. The upsampling provided by the interpolator reduces the amplitudes of the dominant spurs (e.g., undesired narrow-band signals) caused by the digital-to-analog converter (DAC) output. Because the numerous qubits in the quantum computing system typically share the same RF signal line (e.g., using frequency-division multiplexing), the spurs can interfere with other qubits and cause them to drift from their quantum state.

Notably, the discussion herein is primarily focused on FIR filters (also described as "moving average" filters) to achieve linear phase. However, the various techniques described herein are not limited to FIR filters, but are suitable for other filter topologies, such as infinite impulse response (IIR) filters (also described as "autoregressive" filters), autoregressive moving average (ARMA) filters, autoregressive integrated moving average (ARIMA) filters, and so forth. These filters can be one-dimensional or multidimensional filters.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In some aspects, a filter circuit includes a series-connected arrangement of unit delays and summers in an alternating pattern, and a plurality of coefficient multipliers. Each coefficient multiplier has a respective output connected with one or more of the summers, and includes a multiplexing stage comprising one or more multiplexers addressed using one or more bits of a respective input coefficient vector. A first coefficient multiplier of the plurality of coefficient multipliers includes a partial product stage configured to provide a plurality of integer partial products of an input data vector to the multiplexing stages of the plurality of coefficient multipliers.

In this way, the coefficient multiplications are performed using partial products and multiplexers, instead of using Booth or Wallace tree multipliers or other conventional multiplier architectures having greater complexity and power consumption. The partial products of the input data vector are pre-computed once for each value of the input data vector and used in all coefficient multiplications. Further, the coefficient values of the input coefficient vector need not be static, so the filter circuit may be suitable for adaptive filtering applications, time-varying equalizer applications, and so forth.

FIG. 1 is a diagram illustrating an exemplary quantum computing system 100, according to one or more aspects. The features depicted in the quantum computing system 100 may be used in conjunction with other aspects described herein.

As shown, the quantum computing system 100 comprises a refrigeration system 105, a quantum data plane 110, a control and measurement plane 115, a control processor plane 120, and a host processor 125. In some aspects, the quantum data plane 110 comprises hardware that physically forms a plurality of qubits 112, as well as the structures used to support and/or retain the plurality of qubits 112. The plurality of qubits 112 may have any suitable form, such as quantum dots, superconducting circuits, and so forth.

In some aspects, the quantum data plane 110 comprises further circuitry that operates to measure the states of the plurality of qubits 112, and to manipulate the states of the plurality of qubits 112 when carrying out operations. For example, gate operations may be performed using control signals that alter the Hamiltonian (i.e., a description of the total energy and state dynamics) of the plurality of qubits 112. In some aspects, quantum information in the plurality of qubits 112 may be stored, changed, and/or read by transmitting microwave photons at the plurality of qubits 112.

The control and measurement plane 115 comprises hardware that receives digital control signals from the control processor plane 120, and translates the digital control signals into analog (or wave) control signals that are read and executed in the quantum data plane 110 to perform quantum operations on the plurality of qubits 112. In some aspects, the control and measurement plane 115 comprises one or more coaxial cables or waveguides supporting transmission (and, in some cases, shielding) of signals to and/or from the quantum data plane 110. For example, in an implementation of the quantum data plane 110 having the plurality of qubits 112 formed in superconducting circuits, the control signals may be transmitted to the plurality of qubits 112 through microwave waveguides extending through the refrigeration system 105.

The control and measurement plane 115 further comprises hardware that receives analog outputs from the quantum data plane 110 (representing measurements of qubits), and converts the analog outputs into digital signals that are transmitted to the control processor plane 120. The hardware included in the control and measurement plane 115 may include additional shielding to mitigate the effects of environmental noise on the analog outputs received from the quantum data plane 110.

The control processor plane 120 implements a quantum algorithm or sequence of quantum operations, and provides corresponding instructions to be implemented in the control and measurement plane 115. The host processor 125 is communicatively coupled with the control processor plane 120, and provides digital signal(s) that implement the quantum algorithm in the control processor plane 120 and/or interact with the quantum algorithm.

In some aspects, the quantum algorithm is implemented using quantum circuits, each of which represents a computing routine having a series of quantum operations on the plurality of qubits 112 of the quantum data plane 110. In some aspects, the quantum algorithm may be implemented using development tools and libraries. In some aspects, the quantum algorithm comprises a sequence of gate operations and measurements that are performed in the control and measurement plane 115.

In some aspects, the control processor plane 120 is implemented as one or more processors and a memory (not shown). The one or more processors are any electronic circuitry, including, but not limited to one or a combination of microprocessors, microcontrollers, application-specific integrated circuits (ASIC), application-specific instruction set processors (ASIP), and/or state machines, that is communicatively coupled to the memory and controls the operation of the control processor plane 120.

The one or more processors may include other hardware that operates software to control and process information. The one or more processors executes software stored in the memory to perform any of the functions described herein. The one or more processors control the operation and administration of the control processor plane 120 by processing information (e.g., information received from input devices and/or communicatively coupled electronic devices).

The memory may store, either permanently or temporarily, data, operational software, or other information for the one or more processors. The memory may include any one or a combination of volatile or non-volatile local or remote devices suitable for storing information. For example, the memory may include random access memory (RAM), read only memory (ROM), magnetic storage devices, optical storage devices, or any other suitable information storage device or a combination of these devices. The software represents any suitable set of instructions, logic, or code embodied in a computer-readable storage medium such as the memory. In particular embodiments, the software may include an application executable by the one or more processors to perform one or more of the functions described herein.

Figure 2:
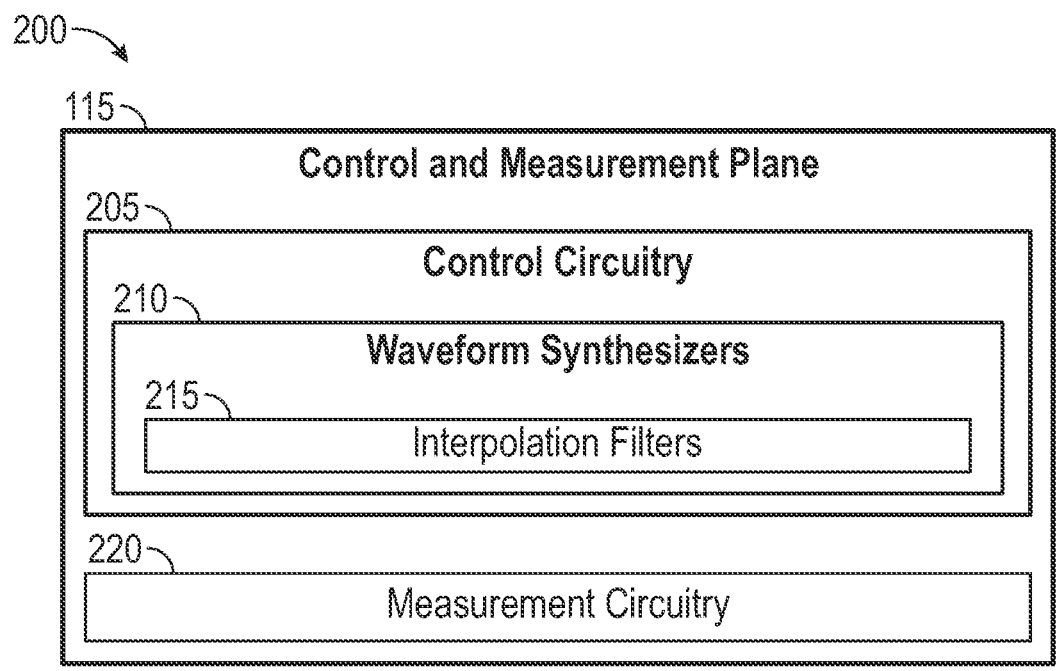
FIG. 2 is a block diagram of an exemplary control and measurement plane, according to one or more aspects.

An exemplary implementation of the control and measurement plane 115 is provided in FIG. 2. In the block diagram 200, the control and measurement plane 115 comprises control circuitry 205 and measurement circuitry 220. The control circuity 205 comprises a plurality of waveform synthesizers 210, which comprise a plurality of interpolation filters 215. In some aspects, each waveform synthesizer of the plurality of waveform synthesizers 210 corresponds to a respective qubit of the plurality of qubits 112. In some aspects, each interpolation filter of the plurality of interpolation filters 215 corresponds to a respective waveform synthesizer of the plurality of waveform synthesizers 210. Exemplary implementations of the plurality of interpolation filters 215 are discussed below with respect to FIGS. 3, 4.

The plurality of waveform synthesizers 210 may have any suitable implementation. For example, the plurality of waveform synthesizers 210 may be implemented with direct digital synthesizers (DDS), phase locked loops (PLLs), and so forth. The plurality of waveform synthesizers 210 synthesize waveforms with any suitable frequencies to support the sampling rates required for the quantum computing system 100. For example, the sampling rate may be in excess of 1 GSPS, such as 2 GSPS or more.

The plurality of interpolation filters 215 may have any suitable implementation. In some aspects, the plurality of interpolation filters 215 include low-pass filters that provide "missing" samples to the synthesized waveforms that effectively increase the overall sampling rates of the plurality of waveform synthesizers 210. For example, assuming that the target sampling rate is 2 GSPS, the plurality of waveform synthesizers 210 may be operated at 1 GSPS and the plurality of interpolation filters 215 may effectively increase the sampling rate from 1 GSPS to 2 GSPS. Other sampling rates and upsampling factors are also contemplated. In this way, the plurality of waveform synthesizers 215 may be implemented with lesser hardware complexity and/or may have lesser power consumption, which tends to reduce the cost of implementing the plurality of waveform synthesizers 210, as well as the power consumed and the heat generated by the plurality of waveform synthesizers 210 that requires removal from the refrigerated environment 140.

In some aspects, the control circuitry 205 transmits multiple pulsed-level analog control signals on a first conductive link 135-1 to the quantum data plane 110 to configure the quantum dots of the plurality of qubits 112, e.g., by electrostatically creating potential wells that move around and trap the electrons that will form the plurality of qubits 112. Although not shown, the quantum data plane 110 may further include a magnet (e.g., a superconducting magnet coil or a permanent magnet) that establishes a static magnetic field that defines the primary qubit state reference axis (e.g., Bloch sphere North-South). A precisely-maintained intermediate frequency phase defines sets the East-West axis location. The quantum data plane 110 may further include smaller magnets (e.g., "micromagnets" arranged adjacent to the plurality of qubits 112) that are used determine the resonant frequency of each of the plurality of qubits 112. In this way, the control signals transmitted by the control circuitry 205 to the plurality of qubits 112 may be frequency-division multiplexed (FDM), such that the first conductive link 135-1 may be implemented as a single coaxial cable.

In some aspects, after the control and measurement plane 115 configures the plurality of qubits 112, the control circuitry 205 resets the plurality of qubits 112. The control circuitry 205 transmits (e.g., using the waveform synthesizers 210 with the plurality of interpolation filters 215) RF gate pulses, interspersed with pulsed analog levels, to perform qubit gate manipulations that configure a subset of the plurality of qubits 112 (e.g., some or all of the plurality of qubits 112) to perform a computation. Any types of quantum gates are contemplated, which may include single-qubit gates such as Pauli-X, Pauli-Y, Pauli-Z gates, Hadamard gates, and multi-qubit gates such as CNOT gates. Collectively, the quantum gates formed by the subset may be described as a quantum algorithm. In some aspects, the control circuitry 205 transmits the RF gate pulses using a second conductive link 135-2.

When the computation is finished, the result of the computation (e.g., binary numbers) is encoded in the states of the subset of the plurality of qubits 112. In some aspects, the control circuitry 205 transmits (e.g., using the waveform synthesizers 210 with the plurality of interpolation filters 215) a combination of analog and RF pulses to access and read the states of the subset of the plurality of qubits 112. In some aspects, reading the states of the subset of the plurality of qubits 112 involves detecting a state-dependent response, such as a change in current corresponding to state-preferential tunneling, that is caused by the interaction with the transmitted analog and RF pulses. In this way, the properties of the analog and RF pulses are selected to minimize disturbances to the qubits' states while still providing accurate measurement results. In some aspects, the control circuitry 205 transmits the pulsed analog signals using a third conductive link 135-3.

The state information describing the states of the subset of the plurality of qubits 112 is transmitted on a fourth conductive link 135-4 to the control and measurement plane 115. In some aspects, the state information is provided to the measurement circuitry 220, which may include hardware such as amplifiers and detectors. The measurement circuitry 220 may perform additional processing to determine the states of the subset of the plurality of qubits 112. Based on the states, the control and measurement plane 115 may adjust one or more control parameters for subsequent operations.

In some aspects, some of the components of the quantum computing system 100 operates within a refrigerated environment 140 maintained by the refrigeration system 105. The refrigerated environment 140 mitigates the effects of thermal noise on various components of the quantum computing system 100. As shown, the hardware of the control and measurement plane 115 and the quantum data plane 110 are disposed within the refrigerated environment 140, and the host processor 125 and the control processor plane 120 are disposed outside the refrigerated environment 140. Other aspects may have different configurations, such as some or all of the control processor plane 120 being disposed within the refrigerated environment 140. In some aspects, the host processor 125 is considered a "classical" processor including any electronic circuitry, including, but not limited to one or a combination of microprocessors, microcontrollers, application-specific integrated circuits (ASIC), application-specific instruction set processors (ASIP), and/or state machines.

In some aspects, the refrigeration system 105 uses liquefied gases (such as liquid nitrogen, liquid hydrogen, or liquid helium) in fluid communication with the refrigerated environment 140 to maintain temperature(s) of about 120 K (−153° C.) or less. In some aspects, the refrigerated environment 140 has temperature(s) that are very close to absolute zero (0 K; −273.15° C.) as superconductivity and the associated quantum characteristics are most pronounced at these temperatures.

In some aspects, the refrigeration system 105 comprises a dilution refrigerator. The dilution refrigerator typically comprises a mixing chamber, a still, and a series of heat exchangers. The dilution refrigerator defines a plurality of temperature stages 130-1, 130-2, . . . , 130-5 operating at progressively lower temperatures. While five (5) stages 130-1, 130-2, . . . , 130-5 are shown, corresponding to 35 K, 4 K, 900 mK, 100 mK, and 10 mK, respectively, different numbers of stages and different temperatures are also contemplated for the dilution refrigerator.

The dilution process starts with a mixture of isotopes, e.g., helium-3 and helium-4, in a liquid form. When this mixture is subjected to low temperatures, the helium-3 component becomes superfluid. As the mixture is pumped through a series of heat exchangers and stages, the helium-3 component is used to cool down the helium-4 component through dilution. This results in a temperature drop of the mixture. The mixing chamber is the coldest part of the dilution refrigerator, e.g., located in the temperature stage 130-5. In some embodiments, the plurality of qubits 112 are disposed in a lowest temperature stage (e.g., temperature stage 130-5) of the plurality of temperature stages, and the control circuitry 205 is disposed in another stage (e.g., temperature stage 130-1) of the plurality of temperature stages.

Figure 3:
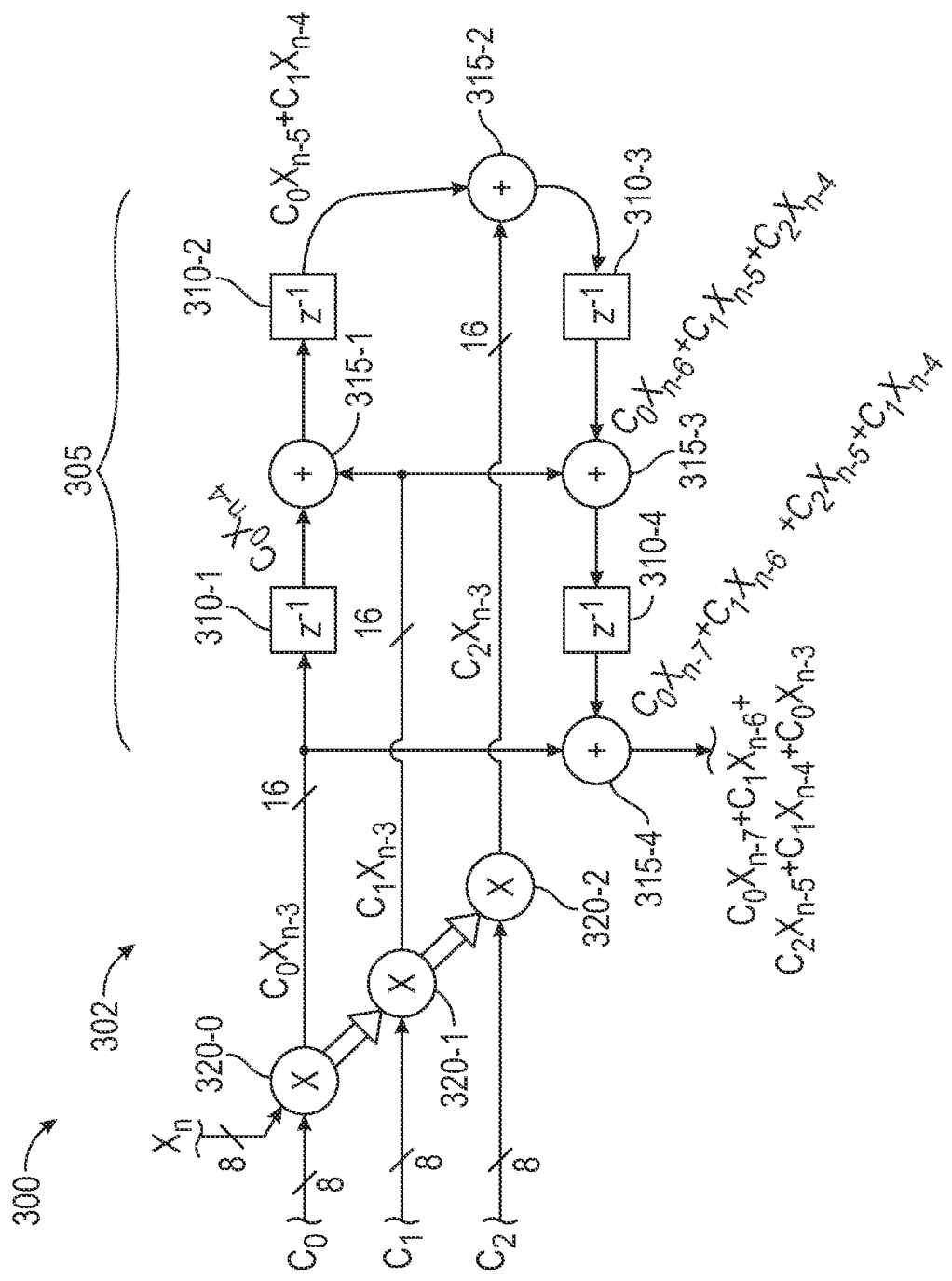
FIG. 3 is a diagram of an even-order folded finite impulse response (FIR) filter having exemplary coefficient multiplier circuits, according to one or more aspects.

FIG. 3 is a diagram 300 of an even-order folded finite impulse response (FIR) filter 302 (also referred to as "filter 302") having exemplary coefficient multiplier circuits, according to one or more aspects. The features illustrated in the diagram 300 may be used in conjunction with other aspects. For example, the filter 302 may represent an example implementation of individual ones of the plurality of interpolation filters 215 of FIG. 2.

The filter 302 comprises a series-connected arrangement 305 of unit delays 310-1, 310-2, 310-3, 310-4 and summers 315-1, 315-2, 315-3, 315-4 in an alternating pattern. Although the filter 302 is shown as a fourth-order folded FIR filter with four (4) unit delays 310-1, . . . , 310-4 and four (4) summers 315-1, . . . , 315-4, other orders and arrangements of the unit delays and summers are also contemplated. Notably, the coefficient multiplier circuits described herein are also contemplated for use with other types of filters, such as non-folded FIR filters, IIR filters, ARMA filters, ARIMA filters, and so forth.

The filter 302 further comprises a plurality of coefficient multipliers 320-0, 320-1, 320-2, each having a respective output that is connected with one or more of the summers 315-1, . . . , 315-4. Each of the plurality of coefficient multipliers 320-0, 320-1, 320-2 receives a respective input coefficient vector $C_0$, $C_1$, $C_2$. As shown, the input coefficient vectors $C_0$, $C_1$, $C_2$ are 8-bits long, but other lengths are also contemplated.

The filter 302 implements a Horner form of the FIR filter equation:

$$Y(z) = \sum_{k=0}^{N} C_k X(z) z^{-k} = \qquad (1)$$
$$C_0 X(z) + z^{-1}\left(C_1 X(z) + \ldots + z^{-1}\left(C_{N-1} X(z) + C_N X(z) z^{-1}\right)\right)$$

where $Y(z)$ represents the z-transform of the output data, N represents the order of the filter 302, $c_k$ represent the filter coefficients (e.g., impulse response values), $z^{-1}$ represents a unit sample delay (e.g., implemented using a register), and $X(z)$ represents the z-transform of an input data vector $x_n$.

FIR filters such as the filter 302 can achieve an exact linear phase for distortion-free operation, which is advantageous when used in the quantum computing system 100. In such cases, the input coefficient vectors $C_0$, $C_1$, $C_2$ that are provided to the plurality of coefficient multipliers 320-0, 320-1, 320-2 are symmetrical about their center. For example, the filter 302 is considered symmetrical because all of the input coefficient vectors other than the input coefficient vector $C_2$ (that is, the input coefficient vectors $C_0$, $C_1$) are reused. For even-order FIR filters such as the filter 302, the center input coefficient vector $C_1$ is not reused. Thus, the filter 320 has a "folded" form and the number of multipliers required to implement the filter 302 is reduced by a factor of 2, which reduces fabrication costs, energy consumption, and/or heat generated by the filter 302. In other aspects, however, the filter 302 need not be implemented to have symmetrical input coefficient vectors.

In some aspects, each of the plurality of coefficient multipliers 320-0, 320-1, 320-2 comprises a multiplexing stage (discussed below with respect to FIGS. 5, 6) comprising one or more multiplexers addressed using one or more bits of the respective input coefficient vector $C_0$, $C_1$, $C_2$. In some aspects, only a first coefficient multiplier 320-0 of the plurality of coefficient multipliers 320-0, 320-1, 320-2 comprises a partial product stage (discussed below with respect to FIGS. 5, 6) configured to provide a plurality of integer partial products of an input data vector $x_n$ to the multiplexing stages of the plurality of coefficient multipliers 320-0, 320-1, 320-2. In this way, the partial products are pre-multiplied by the first coefficient multiplier 320-0 and the downstream coefficient multipliers 320-1, 320-2 need not include hardware to perform redundant multiplication operation(s).

Figure 5:
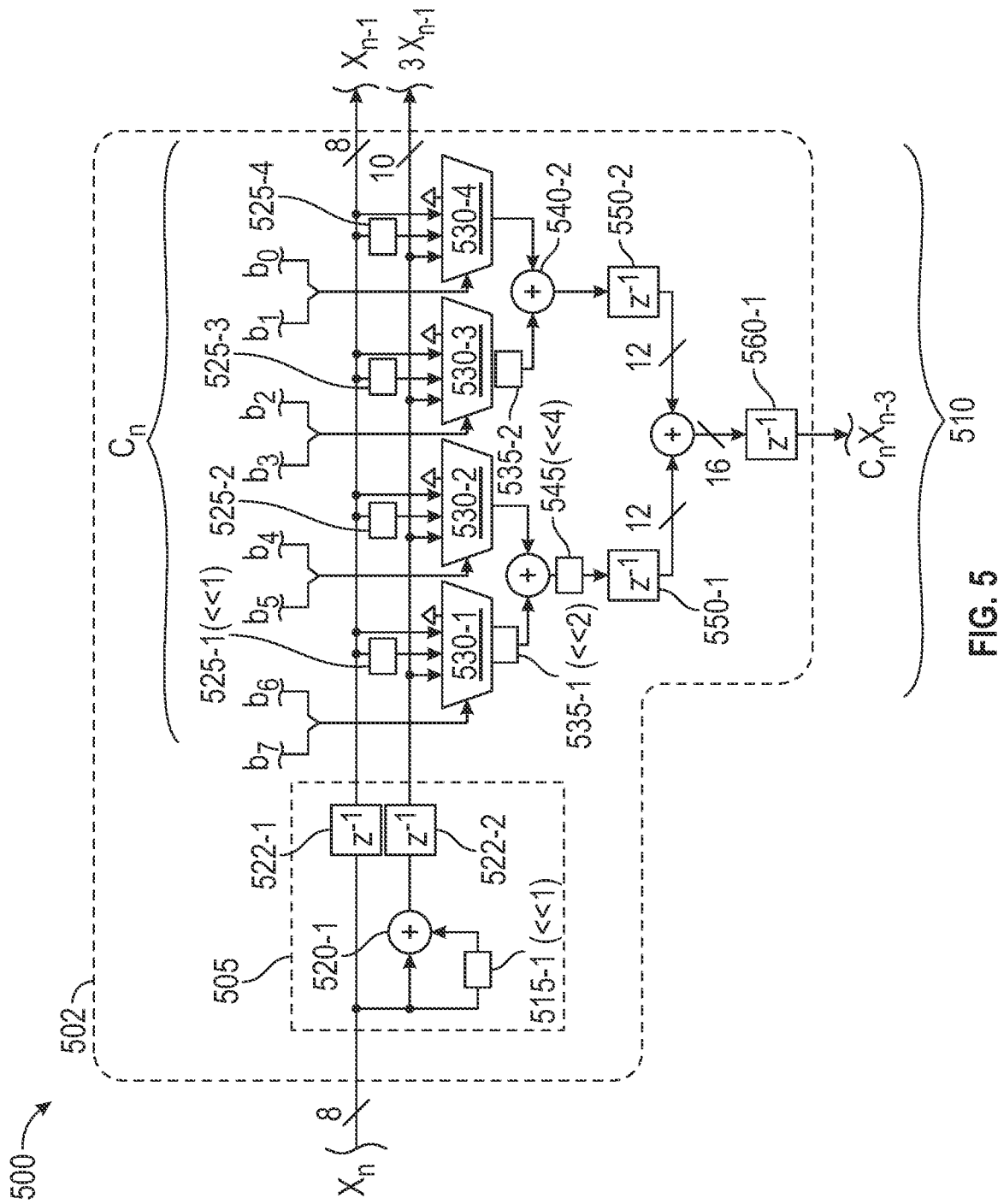
FIG. 5 is a diagram of an exemplary coefficient multiplier circuit for an 8-bit input coefficient vector, according to one or more aspects.

As shown in diagram 300, the first coefficient multiplier 320-0 receives the input coefficient vector $C_0$ and the input data vector $x_n$. The first coefficient multiplier 320-0 has an output that provides a product $C_0 x_{n-3}$ to the unit delay 310-1 and to the summer 315-4. The product $C_0 x_{n-3}$ reflects a previous sample of the input data vector $x_n$ (corresponding to three pipeline stages of the first coefficient multiplier 320-0, e.g., as shown in FIG. 5). A second coefficient multiplier 320-1 receives the input coefficient vector $C_1$ and the partial products from the first coefficient multiplier 320-0. The second coefficient multiplier 320-1 has an output that provides a product $C_1 x_{n-3}$ to the summers 315-1, 315-3. A third coefficient multiplier 320-2 receives the input coefficient vector $C_2$ and the partial products from the first coefficient multiplier 320-0. The third coefficient multiplier 320-2 has an output that provides a product $C_2 x_{n-3}$ to the summer 315-2.

The unit delay 310-1 provides a delayed product $C_0 x_{n-4}$ to the summer 315-1. The summer 315-1 provides a sum $C_0 x_{n-4} + C_1 x_{n-3}$ to the unit delay 310-2, which provides a delayed sum $C_0 x_{n-5} + C_1 x_{n-4}$ to the summer 315-2. The summer 315-2 provides a sum $C_0 x_{n-5} + C_1 x_{n-4} + C_2 x_{n-3}$ to the unit delay 310-3, which provides a delayed sum $C_0 x_{n-6} + C_1 x_{n-5} + C_2 x_{n-4}$ to the summer 315-3. The summer 315-3 provides a sum $C_0 x_{n-6} + C_1 x_{n-5} + C_2 x_{n-4} + C_1 x_{n-3}$ to the unit delay 310-4, which provides a delayed sum $C_0 x_{n-7} + C_1 x_{n-6} + C_2 x_{n-5} + C_1 x_{n-4}$ to the summer 315-4. The summer 315-4 provides a sum $C_0 x_{n-7} + C_1 x_{n-6} + C_2 x_{n-5} + C_1 x_{n-4} + C_0 x_{n-3}$ as the output of the filter 302.

Figure 4:
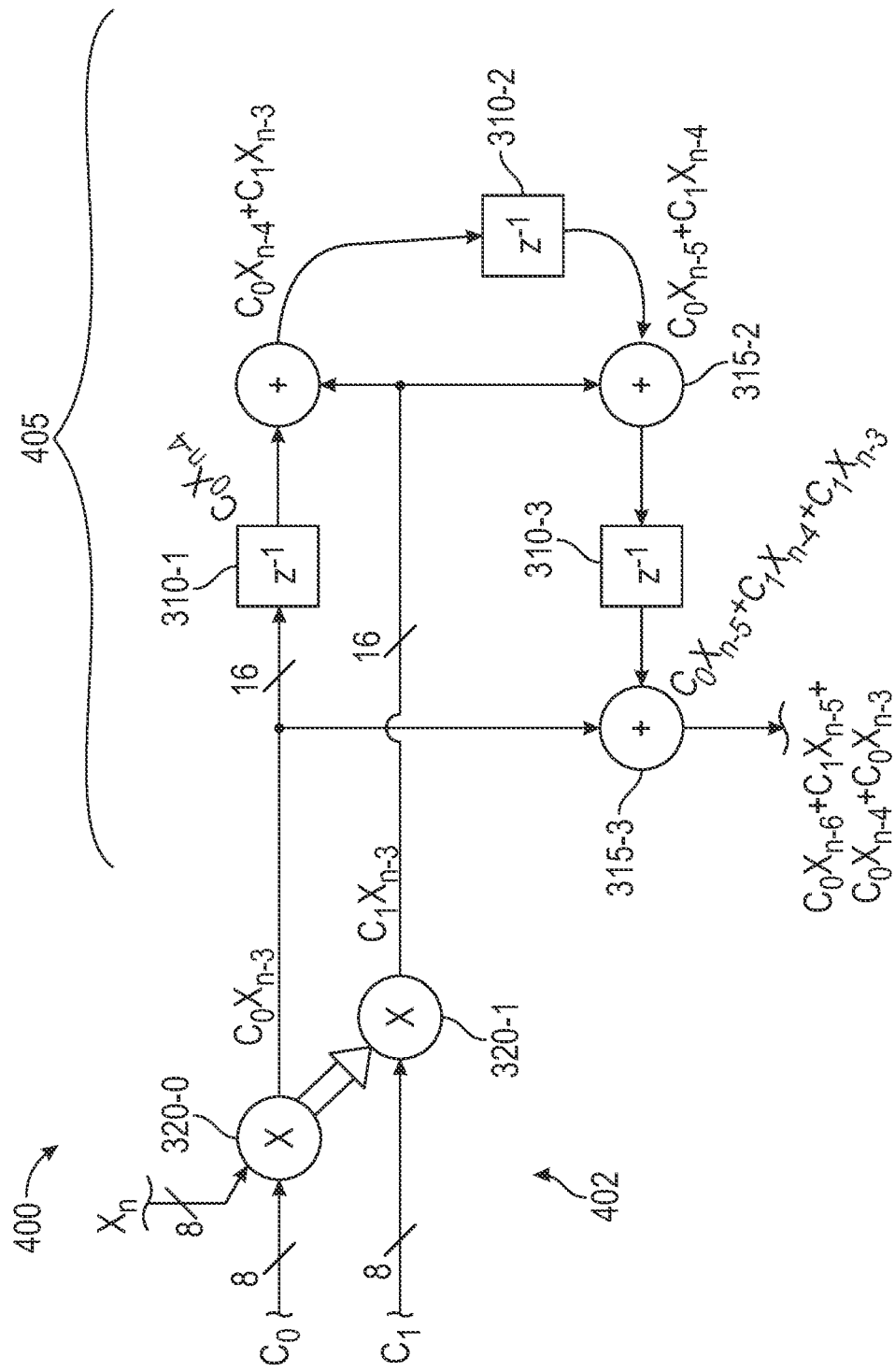
FIG. 4 is a diagram of an odd-order folded FIR filter having exemplary coefficient multiplier circuits, according to one or more aspects.

FIG. 4 is a diagram 400 of an odd-order folded FIR filter 402 (also referred to as "filter 402") having exemplary coefficient multiplier circuits, according to one or more aspects. The features illustrated in the diagram 400 may be used in conjunction with other aspects. For example, the filter 402 may represent an example implementation of individual ones of the plurality of interpolation filters 215 of FIG. 2.

The filter 402 comprises a series-connected arrangement 405 of the unit delays 310-1, 310-2, 310-3 and the summers 315-1, 315-2, 315-3 in an alternating pattern. Although the filter 402 is shown as a third-order filter with three (3) unit delays 310-1, 310-2, 310-3 and three (3) summers 315-1, 315-2, 315-3, other orders and arrangements of the unit delays and summers are also contemplated.

As shown, the first coefficient multiplier 320-0 receives the input coefficient vector $C_0$ and the input data vector $x_n$. The first coefficient multiplier 320-0 has an output that provides a product $C_0 x_{n-3}$ to the unit delay 310-1 and to the summer 315-3. The second coefficient multiplier 320-1 receives the input coefficient vector $C_1$ and the partial products from the first coefficient multiplier 320-0. The second coefficient multiplier 320-1 has an output that provides a product $C_1 x_{n-3}$ to the summers 315-1, 315-2.

The unit delay 310-1 provides a delayed product $C_0 x_{n-4}$ to the summer 315-1. The summer 315-1 provides a sum $C_0 x_{n-4} + C_1 x_{n-3}$ to the unit delay 310-2, which provides a delayed sum $C_0 x_{n-5} + C_1 x_{n-4}$ to the summer 315-2. The summer 315-2 provides a sum $C_0 x_{n-5} + C_1 x_{n-4} + C_1 x_{n-3}$ to the unit delay 310-3, which provides a delayed sum $C_0 x_{n-6} + C_1 x_{n-5} + C_1 x_{n-4}$ to the summer 315-3. The summer 315-3 provides a sum $C_0 x_{n-6} + C_1 x_{n-5} + C_1 x_{n-4} + C_0 x_{n-3}$ as the output of the filter 402.

FIG. 5 is a diagram 500 of an exemplary coefficient multiplier circuit 502 for an 8-bit input coefficient vector, according to one or more aspects. The features illustrated in the diagram 500 may be used in conjunction with other aspects. For example, the coefficient multiplier circuit 502 may represent an example implementation of individual ones of the plurality of coefficient multipliers 320-0, 320-1, 320-2 of FIG. 3. Further, while the features of the coefficient multiplier circuit 502 are described with respect to a folded FIR filter, the coefficient multiplier circuit 502 is contemplated for use in other applications.

The coefficient multiplier circuit 502 comprises a partial product stage 505 that provides a plurality of integer partial products of an input data vector $x_n$. In some aspects, a first coefficient multiplier circuit 502 includes the partial product stage 505, and provides the plurality of integer partial products of the input data vector $x_n$ to one or more subsequent coefficient multiplier circuits 502 that do not include the partial product stage 505.

In some aspects, the partial product stage 505 comprises one or more left-shifters and one or more summers configured to receive the input data vector $x_n$ and an output of one of the one or more left-shifters. As shown, the partial product stage 505 includes one (1) left-shifter 515-1 and one (1) summer 520-1, although other numbers are also contemplated. In some aspects, the one or more left-shifters are implemented using wiring reassignments, and do not require any additional hardware components.

An n-bit left-shift operation is equivalent to multiplication by $2^n$. As shown, the left-shifter 515-1 performs a 1-place shift ("<<1"), which multiplies the input data vector $x_n$ by 2. The summer 520-1 receives the input data vector $x_n$ and the 1-place left-shifted version of the input data vector $x_n$. Thus, the output of the summer 520-1 is $3x_n$.

In some aspects, the partial product stage 505 further comprises unit delays 522-1, 522-2, each of which may be implemented as a pipeline register. The unit delay 522-1 provides a delayed input data vector $x_{n-1}$ and the unit delay 522-2 provides a delayed sum $3x_{n-1}$. Thus, the partial product stage 505 provides two integer partial products of the input data vector $x_{n-1}$ (here, $x_{n-1}$ and $3x_{n-1}$) that are provided to a multiplexing stage 510 of the coefficient multiplier circuit 502, as well as to subsequent coefficient multiplier circuits 502.

The multiplexing stage 510 comprises one or more multiplexers that are configured to receive the plurality of integer partial products of the input data vector. As shown, the multiplexing stage 510 comprises four (4) multiplexers 530-1, 530-2, . . . , 530-4 that are addressed using 2 bits. The one or more multiplexers 530-1, 530-2, . . . , 530-4 are addressed using one or more bits of the input coefficient vector $C_n$. Although each of the multiplexers 530-1, 530-2, . . . , 530-4 is shown as a respective 4-way multiplexer, in other aspects the multiplexing stage 510 may include different configurations of multiplexers (e.g., numbers and/or sizes). Exemplary techniques for determining efficient configurations of multiplexers is discussed below with respect to FIG. 8. The multiplexers 530-1, 530-2, . . . , 530-4 may have any suitable implementation, such as logic gates, transmission gates, etc.

Each of the multiplexers 530-1, . . . , 530-4 receives as inputs the integer partial products of the input data vector $x_{n-1}$ (that is, $x_{n-1}$ and $3x_{n-1}$). In some aspects, the multiplexing stage 510 further comprises a plurality of left-shifters 525-1, 525-2, . . . , 525-4 corresponding to the multiplexers 530-1, . . . , 530-4. Each of the left-shifters 525-1, 525-2, . . . , 525-4 performs a 1-place shift to provide a 1-place left-shifted version of $x_{n-1}$ (that is, $2x_{n-1}$) as another input to the corresponding multiplexer 530-1, . . . , 530-4. In an alternate aspect, the partial product stage 505 may be configured to provide the 1-place left-shifted version of $x_{n-1}$ (that is, $2x_{n-1}$) to the multiplexing stage 510. However, by using the plurality of left-shifters 525-1, 525-2, . . . , 525-4, the 1-place left-shifted version of $x_{n-1}$ can be provided to the multiplexers 530-1, . . . , 530-4 by wiring reassignments and without requiring an additional unit delay to be included in the partial product stage 505. The remaining input to the multiplexers 530-1, . . . , 530-4 is connected to ground (a zero value).

In some aspects, the one or more multiplexers of the multiplexing stage 510 comprise a first multiplexer and a second multiplexer (e.g., the pair of multiplexers 530-1, 530-2 or the pair of multiplexers 530-3, 530-4). In some aspects, the multiplexing stage 510 further comprises a left-shifter (e.g., the left-shifter 535-1 or the left-shifter 535-2) connected to an output of the first multiplexer (e.g., the multiplexer 530-1 or the multiplexer 530-3). The left-shifters 535-1, 535-2 provide 2-place left-shifted versions of the output of the respective multiplexer 530-1, 530-3.

As shown, the multiplexer 530-4 is addressed using the two least significant bits $b_1$, $b_0$ of the input coefficient vector $C_n$, the multiplexer 530-3 is addressed using the next two bits $b_3$, $b_2$, the multiplexer 530-2 is addressed using the next two bits $b_5$, $b_4$, and the multiplexer 530-1 is addressed using the two most significant bits $b_7$, $b_6$. In this way, the one or more bits that address the first multiplexer (e.g., $b_7$, $b_6$ or $b_3$, $b_2$) are more significant bits of the input coefficient vector $C_n$ than those of the second multiplexer (e.g., $b_5$, $b_4$ or $b_1$, $b_0$).

In some aspects, the multiplexing stage 510 further comprises a summer (e.g., the summer 540-1 or the summer 540-2) connected to an output of the second multiplexer (e.g., the multiplexer 530-2 or the multiplexer 530-4), and to an output of the left-shifter (e.g., the left-shifter 535-1 or the left-shifter 535-2). Thus, the output of the multiplexer 530-1 is 2-place left-shifted using the left-shifter 535-1. The summer 540-1 receives the output of the multiplexer 530-2 and the 2-place left-shifted output of the multiplexer 530-1. The summer 540-1 provides a sum that is then 4-bit left-shifted using the left-shifter 545. The 4-bit left-shifted output is provided to a unit delay 550-1 (e.g., a pipeline register), and the delayed output is provided to a summer 555. In some aspects, the summers 520-1, 540-1, 540-2, 555 are implemented at full precision with carry look-ahead adders or subtractors.

The output of the multiplexer 530-3 is 2-bit left-shifted using a left-shifter 535-2. The summer 540-2 receives the output of the multiplexer 530-4 and the 2-bit left-shifted output of the multiplexer 530-3. The summer 540-2 provides a sum that is provided to a unit delay 550-2 (e.g., a pipeline register), and the delayed output is provided to the summer 555. The sum provided by the summer 555 is provided to a unit delay 560-1, and the output of the coefficient multiplier circuit 502 is the product $C_n x_{n-3}$. In some aspects, the output of the coefficient multiplier circuit 502 is connected with the one or more multiplexers 530-1, 530-2, . . . , 530-4, and with one or more summers of the folded FIR filter.

In some aspects, and as shown, the unit delays 522-1, 522-2, 550-1, 550-2, 560-1 (e.g., pipeline registers) are included in the coefficient multiplier circuit 502, such that only a single addition or subtraction operation is performed during each clock cycle by the coefficient multiplier circuit 502. These aspects may be appropriate for certain fabrication technologies or applications, e.g., where speed or transport delay is not critical. Thus, in other aspects, the unit delays 522-1, 522-2, 550-1, 550-2, 560-1 may be omitted from the coefficient multiplier circuit 502.

Thus, in some aspects, the coefficient multiplier circuit 502 performs the precomputation of the 3 times x value (also referred to as a "times 3" or "×3" partial product) once for all coefficients. In a three-coefficient system such as the one shown in FIG. 3, one adder is saved, but in systems having greater numbers of coefficients the benefit is much greater.

Figure 6:
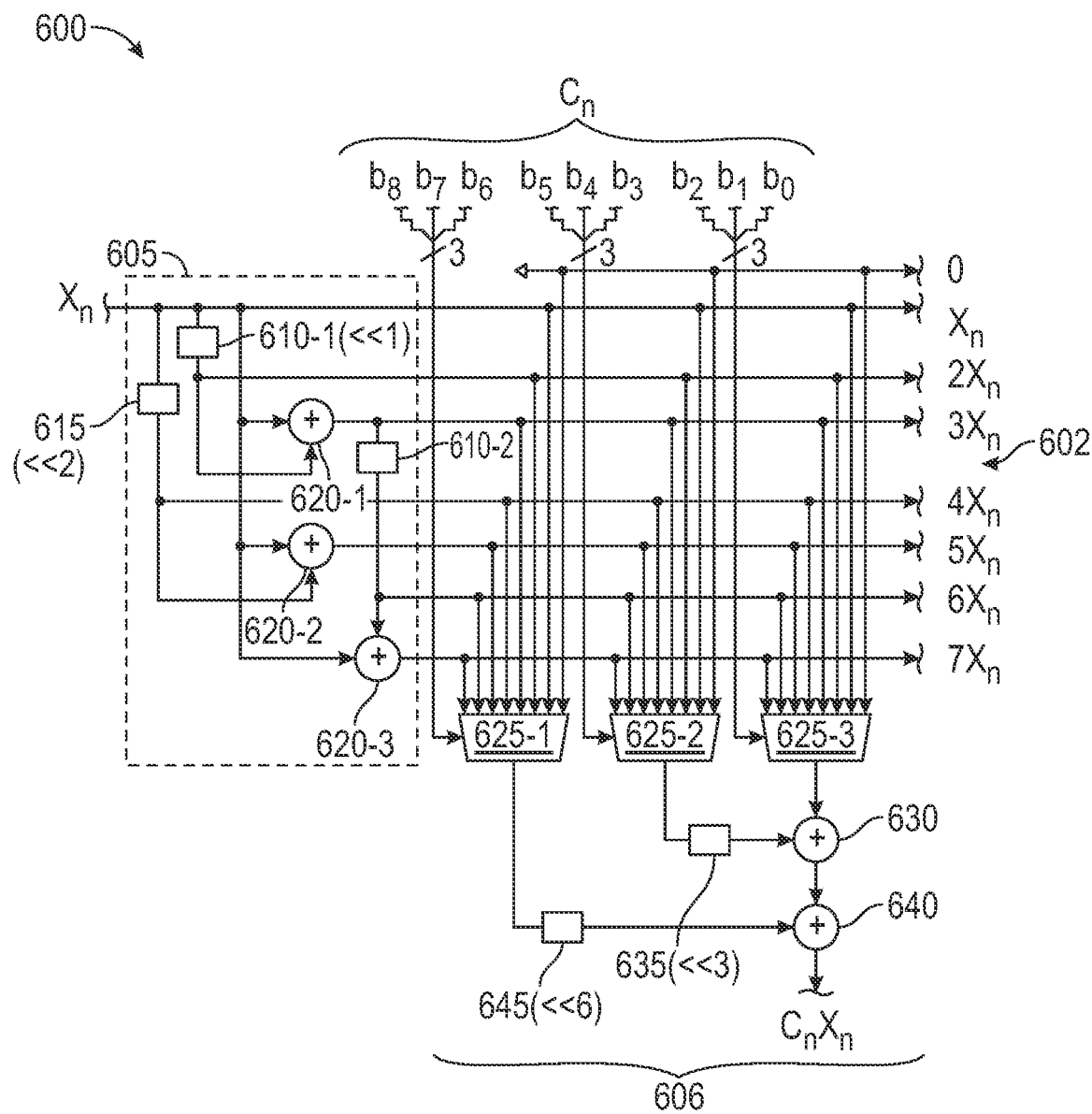
FIG. 6 is a diagram of an exemplary coefficient multiplier circuit for a 9-bit input coefficient vector, according to one or more aspects.

FIG. 6 is a diagram 600 of an exemplary coefficient multiplier circuit 602 for a 9-bit input coefficient vector, according to one or more aspects. The features illustrated in the diagram 600 may be used in conjunction with other aspects. For example, the coefficient multiplier circuit 602 may represent an example implementation of individual ones of the plurality of coefficient multipliers 320-0, 320-1, 320-2 of FIG. 3. Further, while the features of the coefficient multiplier circuit 602 are described with respect to a folded FIR filter, the coefficient multiplier circuit 602 is contemplated for use in other applications.

The coefficient multiplier circuit 602 comprises a partial product stage 605 that provides a plurality of integer partial products of the input data vector $x_n$. In some aspects, a first coefficient multiplier circuit 602 includes the partial product stage 605, and provides the plurality of integer partial products of the input data vector $x_n$ to one or more subsequent coefficient multiplier circuits 602 (e.g., all subsequent coefficient multiplier circuits 602) that do not include the partial product stage 605.

The multiplexing stage 606 comprises one or more multiplexers that are configured to receive the plurality of integer partial products (also referred to as "multiples") of the input data vector $x_n$. As shown, the multiplexing stage 606 comprises three (3) multiplexers 625-1, 625-2, 625-3 that are addressed using 3 bits. The multiplexers 625-1, 625-2, 625-3 are addressed using one or more bits of the input coefficient vector $C_n$. Although each of the multiplexers 625-1, 625-2, 625-3 is shown as a respective 8-way multiplexer, in other aspects the multiplexing stage 606 may include different configurations of multiplexers (e.g., numbers and/or sizes). Thus, in some aspects, each of the one or more multiplexers has a respective M select lines, and the partial product stage 605 provides integer partial products of the input data vector $x_n$ from 0 to $2^M-1$ (M=3 for the coefficient multiplier circuit 602).

In some aspects, the partial product stage 605 comprises one or more left-shifters and one or more summers configured to receive the input data vector $x_n$ and an output of one of the one or more left-shifters. As shown, the partial product stage 605 includes three (3) left-shifters 610-1, 610-2, 615 and three (3) summers 620-1, 620-2, 620-3 although other numbers are also contemplated. The left-shifters 610-1, 610-2 each perform a 1-place shift corresponding to multiplication by 2. The left-shifter 615 performs a 2-place shift corresponding to multiplication by 4.

The summer 620-1 receives the input data vector $x_n$ and the 1-place left-shifted version of the input data vector $x_n$ from the left-shifter 610-1. Thus, the output of the summer 620-1 is $3x_n$. The summer 620-2 receives the input data vector $x_n$ and the 2-place left-shifted version of the input data vector $x_n$ from the left-shifter 615. Thus, the output of the summer 620-2 is $5x_n$. The left-shifter 610-2 receives the output of the summer 620-1 (that is, $3x_n$). The summer 620-3 receives the input data vector $x_n$ and the 1-place left-shifted version of the output from the summer 620-1 (that is, $6x_n$). Thus, the output of the summer 620-3 is $7x_n$.

Each of the multiplexers 625-1, 625-2, 625-3 receives as inputs the integer partial products of the input data vector $x_n$ (that is, $x_n$, $2x_n$, . . . , $7x_n$). The remaining input to the multiplexers 625-1, 625-2, 625-3 is connected to ground (a zero value vector containing as many bits as are contained in the input, $x_n$). As shown, the multiplexer 625-3 is addressed using the three least significant bits $b_2$, $b_1$, $b_0$ of the input coefficient vector $C_n$, the multiplexer 625-2 is addressed using the next three bits $b_5$, $b_4$, $b_3$, the multiplexer 625-1 is addressed using the three most significant bits $b_3$, $b_7$, $b_6$.

In some aspects, the multiplexing stage 606 further comprises a summer 630 connected to an output of the multiplexer 625-3, and a left-shifter 635 connected to an output of the multiplexer 625-2. The left-shifter 635 provides a 3-place left-shifted version of the output to the summer 630. The multiplexing stage 606 further comprises a summer 640 connected to an output of the summer 630, and a left-shifter 645 connected to an output of the multiplexer 625-1. The left-shifter 640 provides a 6-place left-shifted version of the output to the summer 640. In all of these cases, the number of bits being shifted in the multiplexer stage 606 is equal to the number of coefficient bits used in the right summer input. For example, the left-shifter 645 shifts by 6 bits because the right input of summer 640 uses the six bits, $b_5$, $b_4$, $b_3$, $b_2$, $b_1$, and $b_0$ in computing its input value on the right.

In some alternate aspects, the partial product stage 605 and/or the multiplexing stage 606 may include unit delays, such that only a single addition operation is performed during each clock cycle by the coefficient multiplier circuit 602. In some aspects, the coefficient multiplier circuits such as the coefficient multiplier circuits 502, 602 perform unsigned multiplications. The sign of the multiplication may be transferred to the products as follows: if only one of the values, $x_n$ or $C_n$ is negative, the result is negative, otherwise the result is positive. Although the multiplication operations are described in terms of positive integers, floating-point filtering is also supported, as an implicit decimal place is accounted for in the integer value of the coefficients and the scaling of the output of the filter.

Beneficially, by using the partial product stage 605, the integer partial products of the input data vector $x_n$ (e.g., 0, $x_n$, $2x_n$, . . . , $7x_n$) may all be pre-computed, which removes approximately three (3) n-bit-wide carry-look-ahead adders for each subsequent coefficient multiplier circuit 602 at the expense of additional transmission gates (two transistors times the word width) or CMOS and gate implementations in an alternate form of multiplexer.

Further, significant power savings for the FIR filter may be achieved using the partial product stage 605, owing to the reduced hardware requirements and the static nature of the multiplexer selections. For comparison, a conventional implementation of a fully-pipelined, folded 11th order FIR filter incorporating high-speed Wallace tree multipliers requires 297 half-adders, 529 full-adders, and 2418 registers. Using the techniques discussed herein, the 11th order FIR filter may be implemented using 106 half-adders (a 64% reduction), 350 full-adders (a 34% reduction), and 1031 registers (a 57% reduction). High throughput of the FIR filter is achieved through the pipelining of all additions. For example, simulations of an 11th order FIR filter using the coefficient multiplier circuit 602 will operate at 2 GSPS with greatly improved timing margins for digital synthesis.

Figure 7:
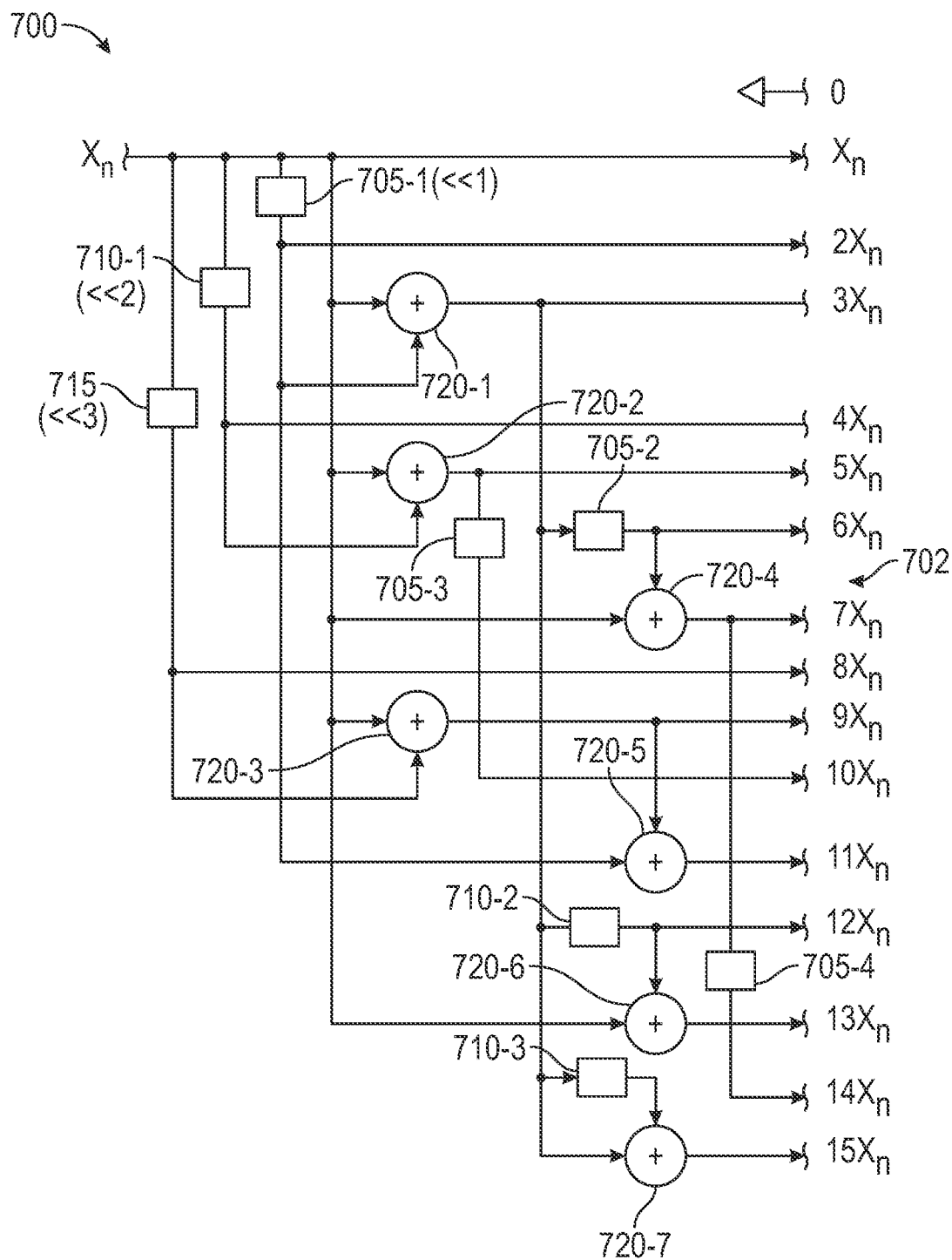
FIG. 7 is a diagram of an exemplary partial product stage for a coefficient multiplier circuit, according to one or more aspects.

FIG. 7 is a diagram 700 of an exemplary partial product stage 702 for a coefficient multiplier circuit, according to one or more aspects. The features illustrated in the diagram 700 may be used in conjunction with other aspects. For example, the partial product stage 702 may be used for a multiplexing stage that addresses its multiplexers using 4 bits. Further, while the features of the partial product stage 702 are described with respect to a coefficient multiplier circuit, the partial product stage 702 is contemplated for use in other applications.

In some aspects, the partial product stage 702 comprises one or more left-shifters and one or more summers configured to receive the input data vector $x_n$ and an output of one of the one or more left-shifters (or summers). As shown, the partial product stage 702 includes eight (8) left-shifters 705-1, 705-2, 705-3, 705-4, 710-1, 710-2, 710-3, 715 and seven (7) summers 720-1, 720-2, . . . , 720-7 although other numbers are also contemplated. The left-shifters 705-1, 705-2, 705-3, 705-4 each perform a 1-place shift corresponding to multiplication by 2, the left-shifters 710-1, 710-2, 710-3 each perform a 2-place shift corresponding to multiplication by 4, and the left-shifter 715 performs a 3-place shift corresponding to multiplication by 8.

The summer 720-1 receives the input data vector $x_n$ and the 1-place left-shifted version of the input data vector $x_n$ from the left-shifter 705-1. Thus, the output of the summer 720-1 is $3x_n$. The summer 720-2 receives the input data vector $x_n$ and the 2-place left-shifted version of the input data vector $x_n$ from the left-shifter 710-1. Thus, the output of the summer 720-2 is $5x_n$. The summer 720-3 receives the input data vector $x_n$ and the 3-place left-shifted version of the input data vector $x_n$ from the left-shifter 715. Thus, the output of the summer 720-3 is $9x_n$.

The left-shifter 705-2 receives the output of the summer 720-1 (that is, $3x_n$). The summer 720-4 receives the input data vector $x_n$ and the 1-place left-shifted version of the output from the summer 720-1 (that is, $6x_n$). Thus, the output of the summer 720-4 is $7x_n$.

The left-shifter 705-3 receives the output of the summer 720-2 (that is, $5x_n$) and provides a 1-place left-shifted version of the output from the summer 720-2 (that is, $10x_n$). The left-shifter 705-4 receives the output of the summer 720-4 (that is, $7x_n$) and provides a 1-place left-shifted version of the output from the summer 720-4 (that is, $14x_n$).

The left-shifter 710-2 receives the output of the summer 720-1 (that is, $3x_n$) and provides a 2-place left-shifted version of the output from the summer 720-1 (that is, $12x_n$). The left-shifter 710-3 receives the output of the summer 720-1 (that is, $3x_n$) and provides a 2-place left-shifted version of the output from the summer 720-1 (that is, $12x_n$).

The summer 720-5 receives the output from the summer 720-3 (that is, $9x_n$) and the 1-place left-shifted version of the input data vector $x_n$ from the left-shifter 705-1 (that is, $2x_n$). Thus, the output of the summer 720-5 is $11x_n$. The summer 720-6 receives the input data vector $x_n$ and the output from the left-shifter 710-2 (that is, $12x_n$). Thus, the output of the summer 720-6 is $13x_n$. The summer 720-7 receives the output of the summer 720-1 (that is, $3x_n$) and the 2-place left-shifted version of the output from the left-shifter 710-3. Thus, the output of the summer 720-7 is $15x_n$. Other combinations of summing and left-shifting of values for the partial product stage 702 are also contemplated.

Figure 8:
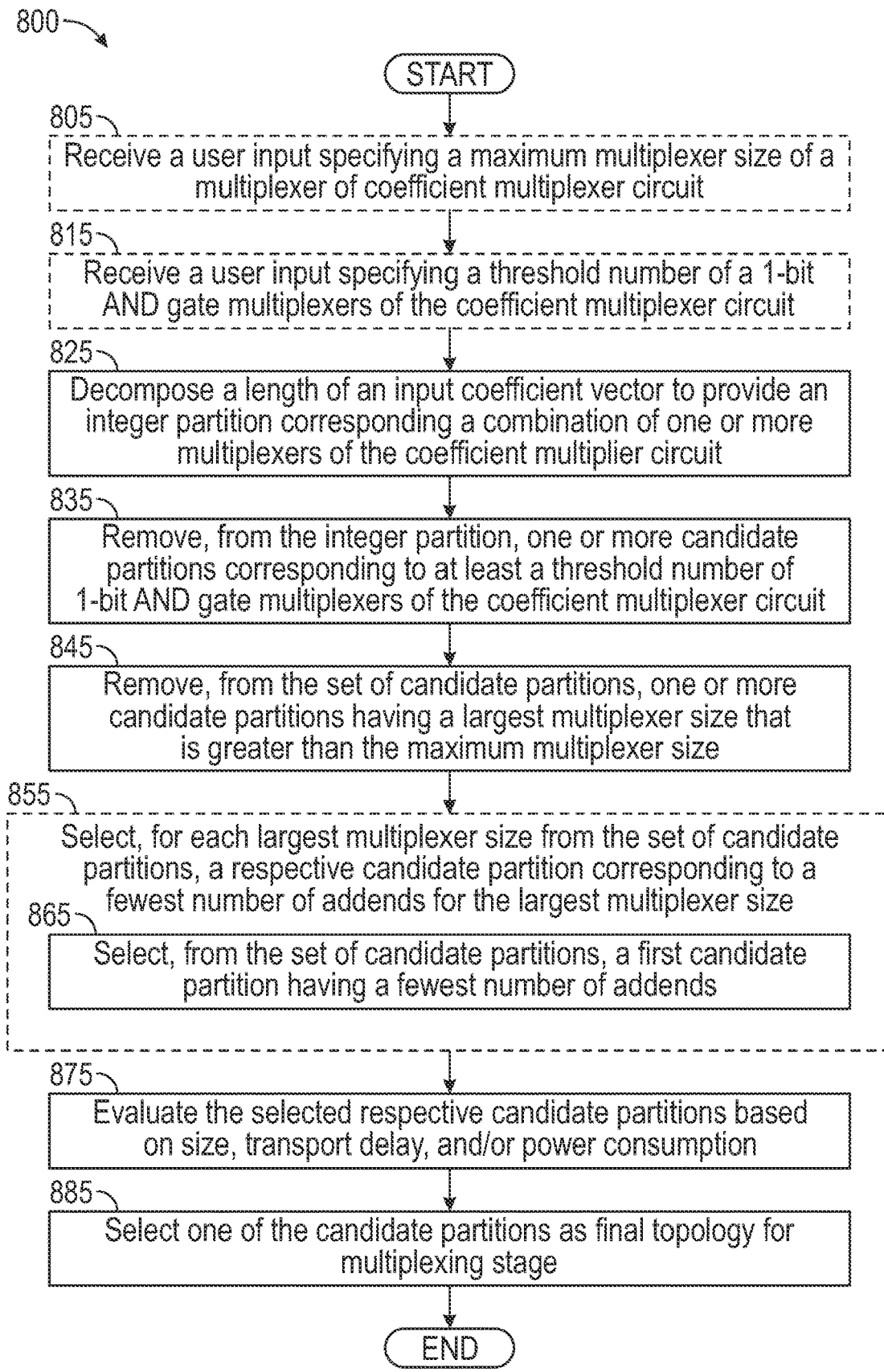
FIG. 8 is an exemplary method of producing a coefficient multiplier circuit, according to one or more aspects.

FIG. 8 is an exemplary method 800 of producing a coefficient multiplier circuit, according to one or more aspects. The method 800 may be used in conjunction with other aspects. For example, the method 800 may be used to determine an efficient configuration of multiplexers for a multiplexer stage of the coefficient multiplier circuit, which in some cases is performed during the design phase of the coefficient multiplier circuit. Further, in some aspects, the method 800 may be performed in conjunction with one or more electronic devices, whether implemented in circuitry (e.g., within an integrated circuit), computer program code, and so forth.

The method 800 begins at optional block 805, where an electronic device receives a user input specifying a maximum multiplexer size of a multiplexer of a coefficient multiplier circuit. Some examples of the maximum multiplexer size include 2-way, 4-way, and 8-way (which correspond to 1-bit, 2-bit, and 3-bit addressing, respectively), and so forth. The maximum multiplexer size threshold places an upper bound on the complexity of the partial product computations. At optional block 815, the electronic device receives a user input specifying a threshold number of 1-bit AND gate multiplexers to be included in the coefficient multiplexer circuit. Numerous 1-bit AND gate multiplexers increase the number of adders that are required below the multiplexers (e.g., as shown in FIGS. 5, 6).

At block 825, the electronic device decomposes a length of an input coefficient vector to provide an integer partition corresponding to a combination of one or more multiplexers of the coefficient multiplier circuit. For example, using the example of FIG. 6 having a 9-bit input coefficient vector $C_n$, the length of the input coefficient vector $C_n$ may be decomposed into the following integer partition: {9, 8+1, 7+2, 7+1+1, 6+3, 6+2+1, 6+1+1+1, 5+4, 5+3+1, 5+2+2, 5+2+1+1, 5+1+1+1+1, 4+4+1, 4+3+2, 4+3+1+1, 4+2+2+1, 4+2+1+1+1, 4+1+1+1+1+1, 3+3+3, 3+3+2+1, 3+3+1+1+1, 3+2+2+2, 3+2+2+1+1, 3+2+1+1+1+1, 3+1+1+1+1+1+1, 2+2+2+2+1, 2+2+2+1+1+1, 2+2+1+1+1+1+1, 2+1+1+1+1+1+1+1, 1+1+1+1+1+1+1+1+1}. In some aspects, each of the "1" instances occurring within the values of the set may be implemented as a respective 1-bit AND gate multiplexer in the multiplexer stage, and each of the non-"1" instances may be implemented as a respective multiplexer in the multiplexer stage where the non-"1" value represents the number of address bits in the selection address input. Thus, the multiplexer stage could potentially be produced as a 9-bit addressed multiplexer (512-way), an 8-bit-addressed multiplexer (256-way) and a 1-bit AND gate multiplexer, and so forth.

At block 835, the electronic device removes, from the integer partition, one or more candidate partitions corresponding to at least a threshold number of 1-bit AND gate multiplexers of the coefficient multiplier circuit. An excessive number of 1-bit AND gate multiplexers within the multiplexer stage may correspond to an unacceptable hardware complexity, transport delay, and/or power consumption in the multiplexing stage. Assuming the threshold number of 1-bit AND gate multiplexers is 2 (indicating that only one 1-bit AND gate multiplexer is acceptable), the set of candidate partitions may be reduced to the following subset: {9, 8+1, 7+2, 6+3, 6+2+1, 5+4, 5+3+1, 5+2+2, 4+4+1, 4+3+2, 4+2+2+1, 3+3+3, 3+3+2+1, 3+2+2+2, 2+2+2+2+1}.

At block 845, the electronic device removes, from the set of candidate partitions, one or more candidate partitions having a largest multiplexer size that is greater than the maximum multiplexer size (e.g., specified at block 805). An excessive size of the multiplexer may correspond to an unacceptable hardware complexity and/or power consumption of the partial product stage. Assuming a maximum multiplexer size of the multiplexer as 16-way (4-bit-addressed), the subset of block 835 may be reduced to the following subset: {4+4+1, 4+3+2, 4+2+2+1, 3+3+3, 3+3+2+1, 3+2+2+2, 2+2+2+2+1}.

At optional block 855, the electronic device selects, for each largest multiplexer size from the set of candidate partitions, a respective candidate partition corresponding to a fewest number of addends for its largest multiplexer size. For example, the subset of block 845 may be reduced to the following subset: {4+4+1, 4+3+2, 3+3+3, 2+2+2+2+1}. In some aspects, the electronic device applies one or more other criteria that further reduces the number of values for a particular largest multiplexer size to one. For example, this may be responsive to determining that evaluation of the entire subset would be too computationally expensive. As shown, the values {4+4+1, 4+3+2} of the subset of block 855 have a largest multiplexer size of 4-bit-addressed. In one example, assuming that the 4-bit-addressed multiplexer corresponds to a standard size (e.g., less hardware complexity) or is expected to be more efficient than a combination of the 3-bit-addressed multiplexer and the 2-bit-addressed multiplexer, the value {4+4+1} may be selected. In another example, assuming that the combination of the 3-bit-addressed multiplexer and the 2-bit-addressed multiplexer is expected to be more efficient than including a 1-bit AND gate multiplexer, the value {4+3+2} may be selected. Other criteria are also contemplated.

At block 865, the electronic device selects, from the set of candidate partitions, a first candidate partition having a fewest number of addends. For example, the subset of block 855 may be reduced to the following subset: {4+4+1, 3+3+3, 2+2+2+2+1}. In another example (e.g., where the optional block 855 is not performed), the subset of block 845 may be reduced to the following subset: {4+4+1, 4+3+2, 3+3+3}. Beneficially, reducing the set of candidate partitions according to the various blocks of the method 800 saves a substantial amount of computing resources and/or power consumption for subsequent evaluation of the candidate partitions. For example, a FIR filter with a 32-bit input coefficient vector $C_n$ corresponds to more than 8,000 candidate partitions, and an FIR filter with a 64-bit input coefficient vector $C_n$ corresponds to more than 1.7 million candidate partitions.

At block 875, the electronic device evaluates the selected respective candidate partitions based on size, transport delay, and/or power consumption. In some aspects, evaluating the selected respective candidate partitions comprises implementing the candidate partitions in a high level hardware description language (such as Verilog or VHDL), synthesizing and laying out the circuitry, extracting the parasitics, and performing a final simulation.

For a given clock rate, power consumption and size (e.g., layout area) are determined by the number and size of the adders and pipeline registers. The presence of pipeline registers is clock speed-dependent, and may also be determined when pipelining is required. In some high-speed applications, there can be as many pipeline registers as adders. For wide adders, there may be multiple pipelining stages for each adder. The transport delay is determined by the clock speed and is expressed in clock cycles.

Using one example subset (e.g., determined at block 865 above), the partitions of the subset may be analyzed as follows:

| Partition | Number of Adders | Transport Delay (Clock cycles) |
| --- | --- | --- |
| {4 + 3 + 2} | 49 | 6 |
| {4 + 4 + 1} | 49 | 6 |
| {3 + 3 + 3} | 21 | 5 |

Based on the results of the evaluation, the electronic device selects (at block 885) one of the candidate partitions as the final topology for the multiplexing stage. In some aspects, the electronic device may present the selected respective candidate partitions to a user, and may receive a user input selecting one of the candidate partitions. In other aspects, the electronic device may make the selection automatically according to one or more criteria for the evaluation.

In this case, the partition {3+3+3} may be selected as the smaller-sized MUXes require fewer terms to be developed in the partial product stage. Were the {3+3+3} partition not a possibility, the choice between {4+3+2} and {4+4+1} can be based on the fact that it is easier to design a single 16-way (4 address bit) MUX, and reuse the design rather than designing each of a 16-way, 8-way, and 2-way MUX. An alternate design of the 16-way MUX may include two 8-way MUXes combined with a 2-way MUX, and either partition may have layout size advantages. Further, as not all addition elements are the same, e.g., having different numbers of half-adders and full-adders, design synthesis tools may be used to determine size and power to perform a final comparison. The method 800 ends following completion of block 885.

Figure 9:
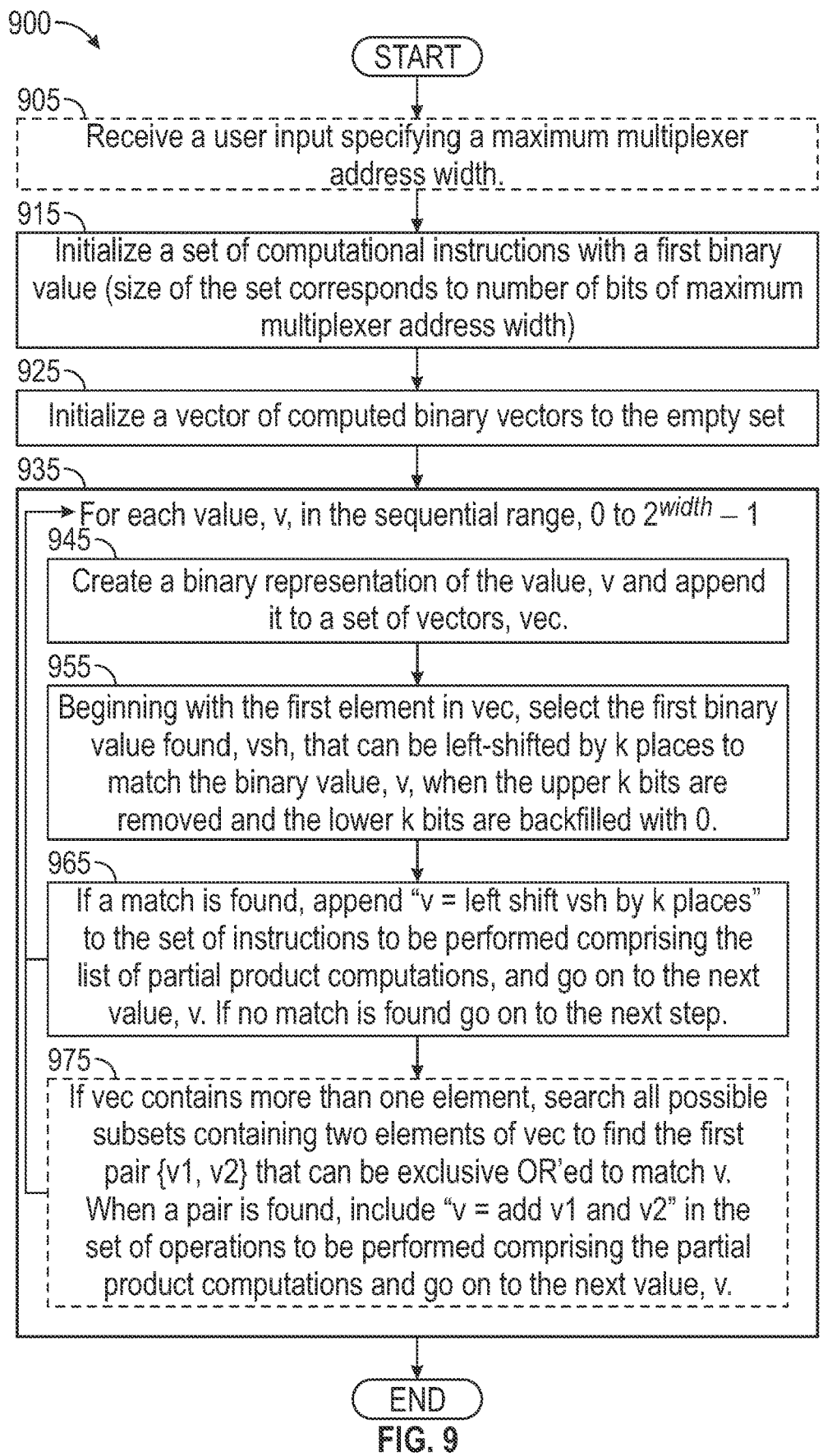
FIG. 9 is an exemplary method of producing a coefficient multiplier circuit, according to one or more aspects.

FIG. 9 is an exemplary method 900 of producing a coefficient multiplier circuit, according to one or more aspects. The method 900 may be used in conjunction with other aspects, e.g., to determine a partial product stage of the coefficient multiplier circuit, which in some cases is performed during the design phase of the coefficient multiplier circuit. Further, in some aspects, the method 900 may be performed in conjunction with one or more electronic devices, whether implemented in circuitry (e.g., within an integrated circuit), computer program code, and so forth.

The method 900 begins at an optional block 905, where an electronic device receives a user input specifying a maximum multiplexer address width. Some examples of the maximum multiplexer address width include 1-bit addressing, 2-bit addressing, and so forth. This maximum multiplexer address width represents a size threshold that places an upper bound on the complexity of the partial product computations.

At block 915, the electronic device initializes a set of computational instructions ("dsn") with a first binary value (e.g., 1). The size of the set of computational instructions corresponds to a number of bits equal to the maximum multiplexer address width (e.g., $2^{width}-1$). In some aspects, following completion of the method 900, the set of computational instructions includes individual vector(s), addition of vector pairs, and/or left-shifting of the individual vector(s). At block 925, the electronic device initializes a vector of computed binary vectors ("vec") to the empty set.

At block 935, the electronic device sequentially determines the operations needed to develop the partial products. In some aspects, these partial products include 0, 1×, 2×, 3×, and so forth, up to the number of signal pathways in the largest multiplexer which is $(2^{width}-1)$x. Block 935 steps through all vectors (v), which are binary representations of zero and the cardinal numbers. The sequence of values of v represent the partial product coefficients of x. For each vector v, blocks 945, 955, 965, and in some cases, block 975 are performed resulting in the definition of a computational operation that will produce that partial product.

At block 945, the electronic device creates a binary vector representation of the value of v having the maximum multiplexer address width defined in block 905. For example, if width=4 and v represents the number 3, the value of v would be {0,0,1,1}. The electronic device appends the value to the set of vectors.

At block 955, and beginning with the first element in the vector of computed binary vectors (vec), the electronic device searches through the vector of computed binary vectors (vec) to find and select a binary value ("vsh") that can be left-shifted by k places to produce the current value of v, where k=1, 2, . . . (width−1). The left-shifting operation involves removing the upper (left-most) k bits from the number in vec, and appending the lower k bits to the number that are backfilled with zeros.

When the left-shifting operation produces a value that matches v, the electronic device stops searching and indicates that a left-shifting operation has been found. If no left-shifted element of vec is found that matches, the electronic device provides an indication that a left-shifting operation cannot be found. At block 965, when a match is found, the electronic device appends "v=left shift vsh by k place(s)" to the set of computational instructions (dsn) to be performed, indicating that a k-place left-shift operation operating on vsh will be used to compute the $v=2^k \cdot x$ partial product. The method 900 returns to block 935 and proceeds to the next value, v.

At the optional block 975, the electronic device has not found a left-shifted value capable of producing the value v derived from the computed binary vectors (vec). Where vec contains more than one element, the electronic device searches all possible subsets having two elements of vec. The electronic device creates a list of all possible pairs of values in vec, and tests each pair to see whether an exclusive OR (XOR) operation will produce the vector, v. When a first matching pair, (v1 XOR v2)=v is found, it is saved in the set of computational instructions (dsn) as "v=v1 plus v2", and the method 900 returns to block 935 and proceeds to the next value, v. Method 900 ends after all of the partial products have been designed.

In some aspects, the method 900 may be implemented using the pseudocode provided below:

```
width=4; (* Maximum MUX address width (bits) *)
vectors={ }; (* vec, List of binary partial product vectors to be
developed *)
design={ }; (* Design operation list *)
(* This algorithm applies for width>2. For each vector, v *)
For[k=0,k<=2^width−1,k++,
    v=IntegerDigits[k,2,width];(* Convert to its binary
representation *)
    vectors=AppendTo[vectors,v];(* Append v to the vector list *)
(* Search each of the vectors for a left-shift solution to prioritize
on left-shift vs. addition *)
```

```
    If[k==0,
        sol=v;lsFound=True;,(* The left-shift solution for the
        first vector equaling 0 is simply that vector *)
        lsFound=False; (* Search for left-shift solutions for non-
        zero vectors starting with the assertion that it has not
        been found *)
    For[i=2,i<=Length[vectors],i++, (* Look at each vector so
    far processed in increasing sequence *)
        sol=leftShiftFound[vectors[[i]],v]; (* Return a left shift
        operation if found *)
        If[!(sol===Null),lsFound=True;Break[ ]] (* If a left-shift
        solution has been found stop searching *)
        ];
    ];
(* Now search for adders if shifts not found *)
(* For each vector element, v, look at all previous combinations to
determine if a sum exists that produces the vector *)
If[lsFound==True,
    (* Left-shift solution found, append to the list of operations *)
    AppendTo[design,{ToString[TraditionalForm[Subscript["V",ToString[
    k]]]]<>" = "<>ToString[sol]}];,
    (* Left-shift not found. List all possible pairs of vectors
    hitherto processed *)
    adderFound=False;
    subsets=Subsets[Select[vectors,#!=Table[0,width]&],{2}];(* All
    subsets not containing all 0's*)
    (* Search through the list of pairs to find the first sum that
produces v *)
    For[i=1,i<= Length[subsets],i++,
        sol=sumFound[subsets[[i,1]],subsets[[i,2]],v];
        If[!(sol===""),adderFound=True;Break[ ];] (* When found stop
        looking *)
        ];
        (* Append adder found to the operation list*)
        If[adderFound,
            AppendTo[design,{ToString[TraditionalForm[Subscript["V",ToS
            tring[k]]]]<>" = "<>ToString[sol]}];,
            AppendTo[design,{ToString[TraditionalForm[Subscript["V",ToS
            tring[k]]]]<>" = "<>ToString[v]}];
        ];
    ];
];
design//Flatten (* Provide the list of operations in the design *)
MatrixForm[design]
```

For example, using the pseudocode, the set of computational instructions (dsn) may be computed as follows:

```
V(0) = {0, 0, 0, 0}
V(1) = {0, 0, 0, 1}
V(2) = Left Shift {0, 0, 0, 1} by 1 place
V(3) = {0, 0, 0, 1} Plus {0, 0, 1, 0}
V(4) = Left Shift {0, 0, 0, 1} by 2 places
V(5) = {0, 0, 0, 1} Plus {0, 1, 0, 0}
V(6) = Left Shift {0, 0, 1, 1} by 1 place
V(7) = {0, 0, 0, 1} Plus {0, 1, 1, 0}
V(8) = Left Shift {0, 0, 1, 0} by 2 places
V(9) = {0, 0, 0, 1} Plus {1, 0, 0, 0}
V(10) = Left Shift {0, 1, 0, 1} by 1 place
V(11) = {0, 0, 0, 1} Plus {1, 0, 1, 0}
V(12) = Left Shift {0, 0, 1, 1} by 2 places
V(13) = {0, 0, 0, 1} Plus {1, 1, 0, 0}
V(14) = Left Shift {0, 1, 1, 1} by 1 place
V(15) = {0, 0, 0, 1} Plus {1, 1, 1, 0}
```

Thus, the present disclosure provides a method of producing a coefficient multiplier circuit in one aspect, the method including: decomposing a length of an input coefficient vector to provide a set of candidate partitions corresponding to one or more multiplexer combinations of the coefficient multiplier circuit. The method further includes removing, from the set of candidate partitions, one or more candidate partitions corresponding to at least a threshold number of 1-bit AND gate multiplexers. The method further includes removing, from the set of candidate partitions, one or more candidate partitions having a largest multiplexer size that is greater than a maximum multiplexer size. The method further includes selecting, from the set of candidate partitions, a first candidate partition having a fewest number of addends.

In one aspect, in combination with any example method above or below, the method further includes receiving a user input specifying the maximum multiplexer size.

In one aspect, in combination with any example method above or below, the method further includes: selecting, for each largest multiplexer size from the set of candidate partitions, a respective candidate partition corresponding to a fewest number of addends for the largest multiplexer size. The first candidate partition is one of the selected respective candidate partitions.

In one aspect, in combination with any example method above or below, the method further includes evaluating the selected respective candidate partitions based on one or more of size, transport delay, and power consumption.

In one aspect, in combination with any example method above or below, the method further includes generating a set of computational instructions corresponding to a maximum address width. Generating the set of computational instructions includes, for each computational instruction of the set, performing one or more of selecting a vector, searching for a left-shifting operation on a vector of a previously determined computational results of the set, and searching for an addition operation on two vectors, at least one vector of which is from a previously determined computational result of the set.

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects described herein may take the form of a computer program product embodied in one or more computer readable storage medium(s) having computer readable program code embodied thereon.

Program code embodied on a computer readable storage medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to aspects of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various aspects of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A filter circuit comprising:
 a series-connected arrangement of unit delays and summers in an alternating pattern; and
 a plurality of coefficient multipliers, each having a respective output connected with one or more of the summers, and each comprising a multiplexing stage comprising one or more multiplexers addressed using one or more bits of a respective input coefficient vector,
 wherein a first coefficient multiplier of the plurality of coefficient multipliers comprises a partial product stage configured to provide a plurality of integer partial products of an input data vector to the multiplexing stages of the plurality of coefficient multipliers.

2. The filter circuit of claim 1, wherein the one or more multiplexers comprise a first multiplexer and a second multiplexer, the multiplexing stage further comprising:
   a left-shifter connected with an output of the first multiplexer, wherein the one or more bits that address the first multiplexer are more significant than the one or more bits that address the second multiplexer; and
   a summer connected with an output of the second multiplexer, and to an output of the left-shifter.

3. The filter circuit of claim 2, the multiplexing stage further comprising:
   a unit delay connected with an output of the summer.

4. The filter circuit of claim 1, wherein the partial product stage comprises:
   one or more left-shifters; and
   one or more summers configured to receive the input data vector and an output of one of the one or more left-shifters.

5. The filter circuit of claim 1, wherein the respective input coefficient vector is symmetrical.

6. The filter circuit of claim 1, wherein the one or more multiplexers of the first coefficient multiplier has a respective N select lines, and wherein the partial product stage is configured to provide integer partial products from 0 to $2^N-1$.

7. A coefficient multiplier circuit for a filter, the coefficient multiplier circuit comprising:
   a partial product stage configured to provide a plurality of integer partial products of an input data vector; and
   a multiplexing stage comprising:
      one or more multiplexers configured to receive the plurality of integer partial products of the input data vector, and addressed using one or more bits of an input coefficient vector; and
      an output connected with the one or more multiplexers, and with one or more summers of the filter.

8. The coefficient multiplier circuit of claim 7, wherein the filter is one of a finite impulse response (FIR) filter, an infinite impulse response (IIR) filter, and an autoregressive, moving average (ARMA) filter.

9. The coefficient multiplier circuit of claim 7, wherein the one or more multiplexers comprise a first multiplexer and a second multiplexer, the multiplexing stage further comprising:
   a left-shifter connected to an output of the first multiplexer, wherein the one or more bits that address the first multiplexer are more significant bits of the input coefficient vector than those of the second multiplexer; and
   a summer connected to an output of the second multiplexer, and to an output of the left-shifter.

10. The coefficient multiplier circuit of claim 9, the multiplexing stage further comprising:
   a unit delay connected with an output of the summer.

11. The coefficient multiplier circuit of claim 7, wherein the partial product stage comprises:
   one or more left-shifters; and
   one or more summers configured to receive the input data vector and an output of one of the one or more left-shifters.

12. The coefficient multiplier circuit of claim 7, wherein the one or more multiplexers has a respective N select lines, and wherein the partial product stage is configured to provide integer partial products from 0 to $2^N-1$.

13. The coefficient multiplier circuit of claim 7, further comprising:
   a second multiplexing stage comprising:
      one or more second multiplexers configured to receive the plurality of integer partial products of the input data vector, and addressed using one or more bits of a second input coefficient vector; and
      a second output connected with the one or more second multiplexers, and with one or more other summers of the filter.

14. A system comprising:
   a refrigeration system configured to maintain a refrigerated environment;
   a plurality of qubits disposed in the refrigerated environment; and
   control circuitry connected to the plurality of qubits, the control circuitry comprising, for each qubit of the plurality of qubits, a respective waveform synthesizer configured to drive the qubit, wherein the respective waveform synthesizer comprises an interpolation filter circuit comprising:
      a series-connected arrangement of unit delays and summers in an alternating pattern; and
      a plurality of coefficient multipliers, each having a respective output connected with one or more of the summers, and each comprising a multiplexing stage comprising one or more multiplexers addressed using one or more bits of a respective input coefficient vector,
   wherein a first coefficient multiplier of the plurality of coefficient multipliers comprises a partial product stage configured to provide a plurality of integer partial products of an input data vector to the multiplexing stages of the plurality of coefficient multipliers.

15. The system of claim 14, wherein the refrigeration system comprises a dilution refrigerator defining a plurality of temperature stages, wherein the plurality of qubits are disposed in a lowest temperature stage of the plurality of temperature stages, and wherein the control circuitry is disposed in another stage of the plurality of temperature stages.

16. The system of claim 14, wherein the one or more multiplexers comprise a first multiplexer and a second multiplexer, the multiplexing stage further comprising:
   a left-shifter connected with an output of the first multiplexer, wherein the one or more bits that address the first multiplexer are more significant than the one or more bits that address the second multiplexer; and
   a summer connected with an output of the second multiplexer, and to an output of the left-shifter.

17. The system of claim 16, the multiplexing stage further comprising:
   a unit delay connected with an output of the summer.

18. The system of claim 14, wherein the partial product stage comprises:
   one or more left-shifters; and
   one or more summers configured to receive the input data vector and an output of one of the one or more left-shifters.

19. The system of claim 14, wherein the respective input coefficient vector is symmetrical.

20. The system of claim 14, wherein the one or more multiplexers of the first coefficient multiplier has a respective N select lines, and wherein the partial product stage is configured to provide integer partial products from 0 to $2^N-1$.

* * * * *